United States Patent [19]
Oh et al.

[11] Patent Number: 6,011,425
[45] Date of Patent: Jan. 4, 2000

[54] CMOS OFFSET TRIMMING CIRCUIT AND OFFSET GENERATION CIRCUIT

[75] Inventors: Chang-Jun Oh, Daejeon; Ook Kim, Seoul; Jong-Kee Kwon, Daejeon; Jong-Ryul Lee, Daejeon; Won-Chul Song, Daejeon; Kyung-Soo Kim, Daejeon, all of Rep. of Korea

[73] Assignee: Electronics and Telecommunications Research Institute, Daejeon, Rep. of Korea

[21] Appl. No.: 08/893,459

[22] Filed: Jul. 11, 1997

[30] Foreign Application Priority Data

Dec. 5, 1996 [KR] Rep. of Korea ............ 96-62145

[51] Int. Cl.[7] ............................................. H01H 37/76
[52] U.S. Cl. ................................. 327/525; 327/307
[58] Field of Search ........................ 327/91, 94, 307, 327/525

[56] References Cited

U.S. PATENT DOCUMENTS

| | | |
|---|---|---|
| 4,987,327 | 1/1991 | Fernandez et al. . |
| 5,325,045 | 6/1994 | Sundby ........................... 323/313 |
| 5,471,154 | 11/1995 | Gorden et al. ................. 327/525 |
| 5,635,854 | 6/1997 | Shimanek et al. .............. 327/525 |
| 5,731,760 | 3/1998 | Ramirez ........................ 327/525 |
| 5,808,944 | 9/1998 | Yoshitake et al. ............. 365/200 |

OTHER PUBLICATIONS

Carley, L.R., *Trimming Analog Circuits Using Floating–Gate Analog MOS Memory*, IEEE International Solid–State Circuits Conference, Feb. 15, 1989, pp. 202–203.

Ramirez–Angulo, J., *Digitally Trimmable MOS–Current Mirrors for High Precision Applications*, IEEE, 1993, pp. 974–977.

*Primary Examiner*—Terry D. Cunningham
*Attorney, Agent, or Firm*—Cohen, Pontani, Lieberman & Pavane

[57] ABSTRACT

A CMOS offset trimming circuit and offset generation circuit for obtaining the corrected optimum offset value for correcting the offset generated in the CMOS analog circuit. An offset trimming circuit comprises a flip-flop for loading a data to be used for obtaining an optimum offset value or a data to be trimmed according to an input clock, a fuse circuit for setting the circuit with a corrected optimum offset value obtained in a corresponding mode by receiving the data loaded on the flip-flop and the mode selection signal as an input signal, and a selection logic circuit for outputting a selected signal as a trimming output signal by selecting one from the group consisting of the data loaded on the flip-flop and the data output from the fuse circuit according to the operation mode.

5 Claims, 3 Drawing Sheets

CMOS OFFSET TRIMMING CIRCUIT AND OFFSET GENERATION CIRCUIT

BACKGROUND OF THE INVENTION

1. Field of the Invention

The present invention relates to the field of integrated circuit, and more particularly to a CMOS offset trimming circuit and an offset generation circuit using the same.

2. Background of the Invention

Generally, offset is more frequently generated in the CMOS analog circuit than in the bipolar circuit because of the factors such as a mismatch, a change of Vt, and a body effect in the MOS transistor. It is an inevitable phenomenon in view of the characteristics of the CMOS process and the characteristics of the MOS transistor. But, the best way for realizing a precise analog circuit is to minimize the generation of the offset by an appropriate correction.

In case that the trimming is effected by cutting a metal line, it is important to obtain an optimum offset correction value before the cutting of the metal line, since the metal line can not be restored to its original state. In the present invention, the optimum offset correction value can be obtained by changing the value of the offset within a permitted correction range. And, the trimming is performed using the optimum offset value. Thus, the offset of the CMOS analog circuit can be minimized.

According to the prior art, it is impossible to obtain an optimum correction value for minimizing the offset. And, the number of pins required for the correction is increased in proportion to the offset correction range in case that a wide range of offset correction is needed. Further, the cost for manufacturing the integrated circuit is high due to an additive process required for the trimming.

When the analog circuit is realized as an integrated circuit, it is necessary to perform the trimming after the manufacturing process thereof. In particular, it is on an increasing trend to embody the analog integrated circuit by CMOS rather than by bipolar. In view of the real situation as above, the need of the trimming technique for the offset correction is greatly emphasized. But, there is no circuit by which the optimum offset value can be obtained in the prior art, so that it is impossible to perform the trimming using the optimum value for minimizing the offset according to the prior art.

SUMMARY OF THE INVENTION

It is an object of the present invention to provide a CMOS offset trimming circuit for obtaining an optimum value for correcting the offset generated in a CMOS analog circuit and performing the trimming using the optimum value, and an offset generation circuit using the same.

In order to accomplish the above object, the present invention provides an offset trimming circuit, which comprises: a flip-flop for loading a data to be used for obtaining an optimum offset value or a data to be trimmed according to an input clock; a fuse circuit for setting the circuit with a corrected optimum offset value obtained in a corresponding mode by receiving the data loaded on the flip-flop and the mode selection signal as an input signal; and a selection logic circuit for outputting a selected signal as a trimming output signal by selecting one from the group consisting of the data loaded on the flip-flop and the data output from the fuse circuit according to the operation mode.

The offset generation circuit according to the present invention is configured to generate an offset by connecting the offset trimming circuit to the input terminals according to the number of bits, and applying the output of the above to a calibration circuit.

BRIEF DESCRIPTION OF THE DRAWINGS

The above and other objects and features of the present invention will become apparent from the following description of preferred embodiments, when taken in conjunction with the accompanying drawings, in which.

DETAILED DESCRIPTION OF THE PREFERRED EMBODIMENTS

Figure 1:
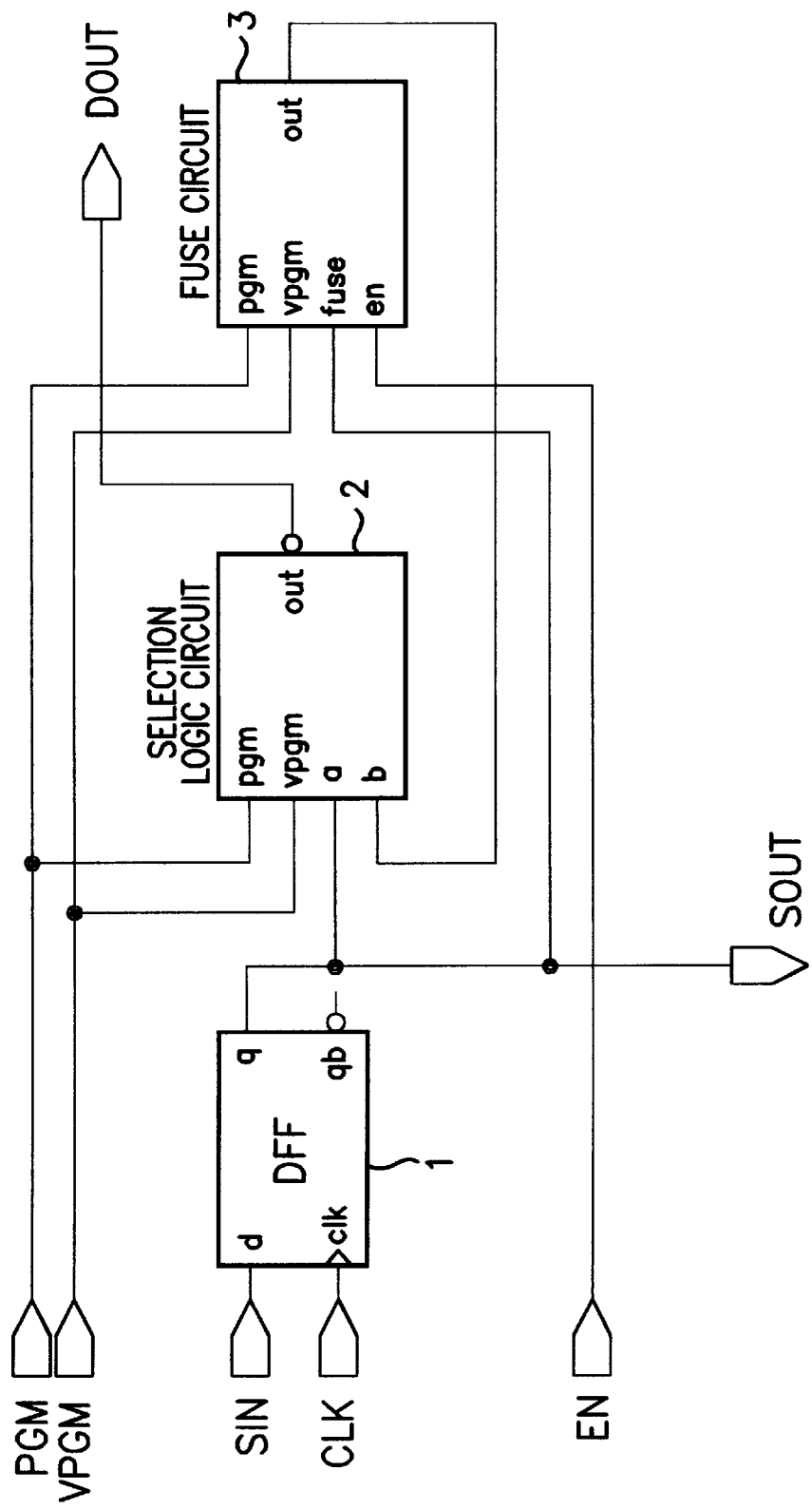
FIG. 1 is a schematic block diagram of an offset trimming circuit according to the present invention.

As shown in FIG. 1, an offset trimming circuit according to the present invention comprises a D flip-flop (DFF) 1, a selection logic circuit 2 and a fuse circuit 3.

The circuit shown in FIG. 1 is operated in four different modes including PROGRAM, FUSE, POWER-OFF and NORMAL.

In PROGRAM mode, an optimum correction value is obtained by loading the D flip-flop 1 with high or low data. In FUSE mode, the D flip-flop 1 is loaded again with the data of the offset correction value obtained in PROGRAM mode, and the metal line of the fuse circuit 3 is cut by applying a high voltage of the power supply voltage or more to a terminal VPGM, so that the optimum correction value is completely set. In NORMAL mode, the main circuit to be trimmed is normally operated without any offset correction from the circuit shown in FIG. 1. In POWER-OFF mode, the circuit shown in FIG. 1 is not operated when the main circuit to be trimmed is not operated.

The D flip-flop 1 is used for the following two purposes. Firstly, the D flip-flop 1 is used for the load of the data for obtaining the corrected optimum offset value thereon in PROGRAM mode. Secondly, the D flip-flop 1 is used for the load of the data of the trimming value, and the transmission of the data to the fuse circuit 3 in FUSE mode. One of the data loaded on the D flip-flop 1 and the output data from the fuse circuit 3 is selected by the selection logic circuit 2 in accordance with each mode, and the selected data is output from the trimming circuit. The fuse circuit 3 sets the trimming circuit with the corrected optimum offset value obtained in PROGRAM mode.

Figure 2:
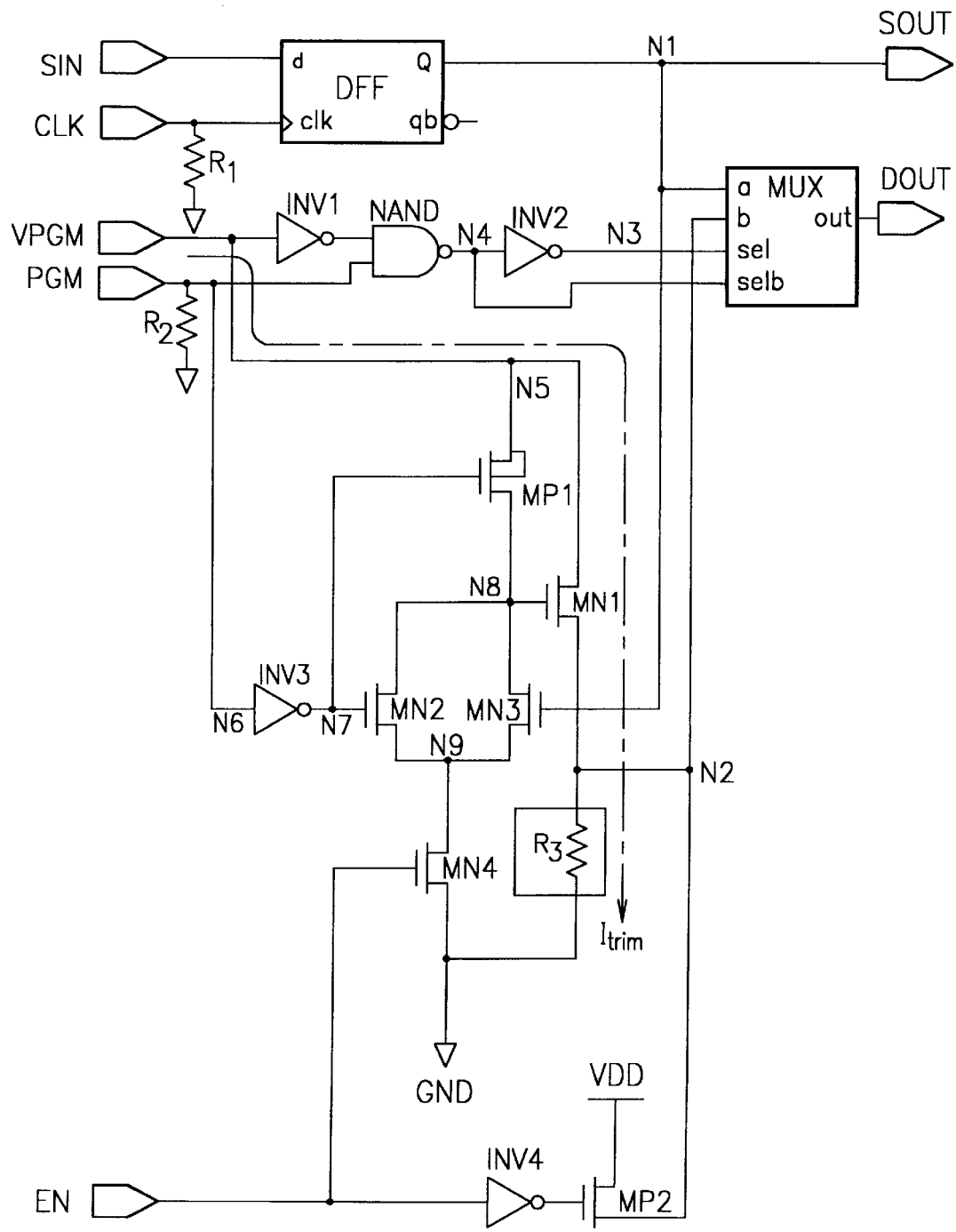
FIG. 2 is a detailed block diagram of an offset trimming circuit according to the present invention.

FIG. 2 is a detailed block diagram of the offset trimming circuit shown in FIG. 1.

Figure 3:
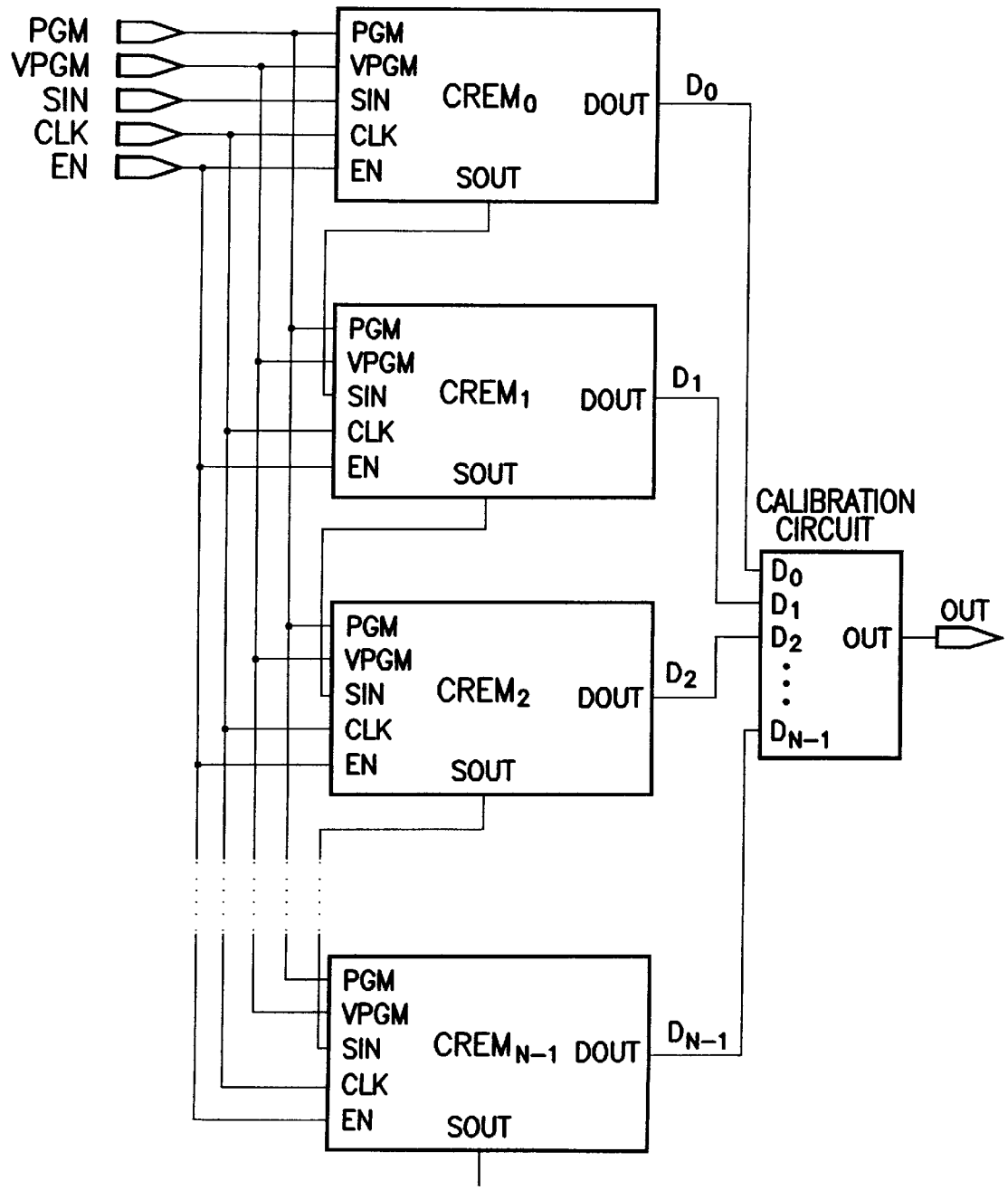
FIG. 3 is a diagram exemplary N-bit expanded offset trimming circuit according to the present invention.

A terminal SIN is for inputting the data to be loaded on the D flip-flop 1 in PROGRAM and FUSE modes. A terminal CLK is for applying a clock signal to the D flip-flop 1. A terminal PGM is for selecting the PROGRAM mode, FUSE mode or NORMAL mode. A terminal VPGM is for applying a high voltage of the power supply voltage or more when the high voltage is required for cutting the metal line in FUSE mode. A terminal EN is for determining whether the POWER-OFF mode is selected or one of the remaining three modes excepting the POWER-OFF mode is selected. There is no need to provide a separate terminal as the terminal EN, but a chip enable terminal used in the main circuit to be trimmed can be commonly used as the terminal EN. A terminal DOUT is a digital output terminal of the trimming circuit, and a terminal SOUT is an output from the D flip-flop 1. When the trimming range is widened, the blocks (shown as blocks CREMs in FIG. 3) each consisting of the circuit of entire FIG. 2 are connected with one another in series by the number of necessary bits (refer to FIG. 3). In FIG. 3, SOUTs are the output terminals of DFFs and connected to the input terminals of DFFs of succeeding stages so as to constitute a shift register. Constituting such a shift register prevents the number of pins from increasing even though the trimming range is widened to increase the number of bits.

The D flip-flop 1 shown in FIG. 1 corresponds to the D flip-flop (DFF) shown in FIG. 2. The selection logic circuit 2 shown in FIG. 1 corresponding to the circuit that consists of inverters INV1 and INV2, a nand gate NAND and a multiplexer MUX in FIG. 2.

And, the fuse circuit shown in FIG. 1 consists of inverters INV 3 and INV 4, PMOS transistors MP1 and MP2, NMOS transistors MN1, MN2, MN3 and MN 4, and a metal resistor R3 for fusing.

When a signal of the "low" state is applied to the terminal EN and the terminals PGM and VPGM are floated (that is, no signal is applied to the terminals PGM and VPGM), the POWER-OFF mode is initiated. Here, the NMOS transistor MN4 turns off since the terminal EN is in its "low" state, the input node N6 of the inverter INV3 turns to its "low" state because of the pull-down resistor R2, and the output node N7 turns to its "high" state.

Therefore, the PMOS transistor MP1 turns off and the NMOS transistor MN1 turns off, thus there is no current flow in the fuse circuit 3 regardless of the signal from the VPGM.

If the input to the selection terminal sel is "high" and the input to the differential terminal selb is "low" in the multiplexer MUX, then the signal to the input a outputs from the multiplexer MUX, and if sel is "low" and selb is "high", then the signal to the input b is outputted to DOUT.

As described above, in the POWER-OFF mode, no signal is applied to the PGM terminal, but the signal of the "low" state is applied to an input of the nand gate because of the pull-down resistor R2.

Therefore, the output from the nand gate, and thus the input node N4 to the inverter INV2 turn to the "high" state, and the output node N3 from the inverter INV2 turns to the "low" state.

As a result, the signal of the "low" and "high" states are input to the input terminals sel and selb of the multiplexer MUX, respectively, so that the output terminal DOUT from the multiplexer MUX turns to the "low" state. If the signal of the "low" and "high" states are applied to the terminals PGM and EN, respectively, the circuit is operated in the NORMAL mode. Since each signal at the terminals PGM and VPGM in the NORMAL mode is the same as that in the POWER-OFF mode, the operation of the selection logic circuit 2 in the NORMAL mode is the same as in the POWER-OFF mode.

But, since a signal of the "high" state is applied to the terminal EN in contrast to the case of the POWER-OFF mode, the output from the inverter INV4 turns to the "low" state, and thus the PMOS transistor MP2 turns on.

In the fuse circuit 3, a signal of "high" is input to the terminal EN, so that the NMOS transistor MN4 turns on. MP1 turns off since the input signal to the terminal PGM is "low", and MN1 turns off since the NMOS transistor MN2 turns on and which results the "low" state of the node N8.

Therefore, in the NORMAL mode, there is no current flow in the fuse circuit 3, and the voltage at the node N2 becomes to the "low" state as in the POWER-OFF mode. While the PMOS transistor MP2 connected to the node N2 turns on and a source terminal of the MP2 is connected to the power supply VDD, the voltage at the node N2 is strongly affected by the passage connected to the ground through the metal resistor R3 in comparison with at a drain terminal if MP2 is constituted by a relatively long channel. Thus, the node N2 turns to the "low" state.

As described above, the operation of the selection logic circuit 2 is the same as in the POWER-OFF mode, the output from MUX is still "low" as in the POWER-OFF mode.

Next, the PROGRAM mode for obtaining the corrected optimum offset value will be described. For the PROGRAM mode, a signal of the "high" state is applied to the terminals PGM and EN, and a signal of the "low" state is applied to the terminal VPGM in order to effect the PROGRAM mode.

The output from INV1 of the selection logic circuit 2 is "high", the output from NAND is "low", and the output from INV2 is "high". Thus, the output from MUX becomes the output node of the D flip-flop (DFF).

Therefore, the output DOUT from MUX is irrelevant to the fuse circuit 3, and dependent on the output data from DFF, that is the data loaded on DFF through the terminal SIN.

If the "high" signal is applied to the terminal SIN and a clock pulse is applied to the terminal CLK, data of the "high" state is loaded on DFF, thus DOUT becomes "high". While, the "low" signal is applied to the terminal SIN and a clock pulse is applied to the terminal CLK, data of the "low" state is loaded on DFF, thus DOUT becomes "low".

As shown in FIG. 3, the signals of the terminals DOUT input to a calibration circuit in which a corrected offset value is calculated based on DOUT.

In response to the change of the data loaded on DFF, the output from MUX is changed and thus the corrected offset value is changed. Every time when the corrected offset value is changed, the characteristics of the offset of the main circuit is measured, and the optimum state can be found from the measured offset characteristics. Here, the calibration circuit may be configured to output the current or the voltage according to an applied circuit by using a simple digital-to-analog converter (DAC).

For the FUSE mode, the signal of the "high" state is applied to the terminals PGM and EN, and a higher voltage than the power supply voltage should be applied to the terminal VPGM. Here, the output from INV1 becomes the "low" state, the output from the nand gate NAND becomes the "high" state, and the output from INV2 becomes the "low" state.

Therefore, the data of the node N2 is output from the output terminal DOUT of MUX because the nodes N3 and N4 are in the "low" and "high" states, respectively. If the optimum state is obtained when the signal of the "low" state is output from the output terminal DOUT in the PROGRAM mode, trimming may be omitted. The reason is that the node N2 is already in the "low" state due to the metal resistance R3 connected to the ground, and thus DOUT becomes the "low" state. On the contrary, if the optimum state is obtained when DOUT is "high", the fuse circuit should be operated so as to effect the "high" state in the node N2.

The operation of the fuse circuit 3 is as follows. The PMOS transistor MP2 and the NMOS transistor MN4 turn ON because the "high" signal is applied to the terminal EN. The "high" signal is applied to the terminal PGM. Thus, the node N7 becomes the "low" state, the PMOS transistor MP1 turns ON, and the NMOS transistor MN2 turns OFF.

And, since MN4 is ON state, the state of MN1 is determined according to the state of the NMOS transistor MN3, and thus whether the metal resistance R3 is to be fused or not depends on ON/OFF states of the transistor MN3. Specifically, if MN3 turns ON the voltage of the node N8 becomes the low state, which leads the result that the NMOS transistor MN1 becomes the "off" state and the metal resistor R3 is not fused.

On the contrary, if MN3 turns OFF, a passage of the current flowing through MN4 is disappeared, and MN1 turns ON. Thus, the trimming current (Itrim) flows through MN1 and R3. Since a high voltage of the power supply voltage or more is applied to the terminal VPGM, the Itrim becomes a high current and the resistor R3 is fused because the resistor is composed of metals. After the fusing of the resistor R3, the state of the node N2 becomes "high" because MP2 is in the ON state, and the signal which is in a desired state is output from DOUT.

In the operation as above, when the trimming is needed by fusing the resistor R3 in the FUSE mode, the data which is in the "low" state should be loaded on DFF so as to be turned OFF MN3. While, when the trimming is not needed, the data which is in the "high" state should be loaded on DFF so as to be turned ON MN3. In other words, the trimming is performed by loading the data on DFF in the FUSE mode by taking the complement of the optimum value obtained in the PROGRAM mode. In order to widen the correction range of the offset, the number of bits should be increased by making the trimming circuit having a lot of stages (refer to FIG. 3).

As shown in FIG. 3, the trimming circuit according to the present invention has the advantage that the number of pins is not increased though the number of bits is increased.

In FIG. 3, each D flip-flop (DFF) of each cell is connected in series to form a shift register. For example, in case of 4-bits, the PROGRAM mode is set by applying the signal of the "high" state to the terminals PGM and EN and applying the signal of the "low" state to the terminal VPGM, in order to obtain the corrected offset value as described above. And, the offset characteristic of the main circuit to be trimmed is measured by loading the digital data including from 0000 to 1111 on the 4-bit shift register, and the value of the shift register is determined as a corrected optimum offset value when the offset is minimum.

Then, the FUSE mode is set and the complement of the optimum value obtained in the PROGRAM mode is loaded on the shift register. Then, a high voltage is applied to the terminal VPGM so as to complete the trimming.

According to the offset trimming circuit of the present invention, it is possible to obtain the optimum trimming value within the offset trimming range. And, the offset trimming circuit of the present invention has advantages that the number of pins is not increased though the offset trimming range is widen, and any additional process is not required.

As described above, although the present invention has been described in detail with reference to illustrative embodiments, the invention is not limited thereto and various modifications and changes may be effected by one skilled in the art within the scope of the invention.

What is claimed is:

1. An offset trimming circuit, comprising:
    a flip-flop for receiving one of a data to be used for obtaining an optimum offset value and a data to be trimmed and transmitting said one of a data to be used for obtaining an optimum offset value and a data to be trimmed according to an input clock;
    a fuse circuit for storing and transmitting a corrected optimum offset value obtained in a corresponding mode by receiving, as input signals, the data transmitted by the flip-flop and a mode selection signal; and
    a selection logic circuit responsive to the mode selection signal for outputting a selected signal as a trimming output signal by selecting one from the group consisting of the data transmitted by the flip-flop and the corrected optimum offset value.

2. The offset trimming circuit of claim 1, wherein the fuse circuit includes:
    a first inverter for inverting the mode selection signal;
    a first PMOS transistor and a first NMOS transistor each having a source, a drain and a gate, said transistor gates receiving the inverted mode selection signal from said first inverter as input data;
    a second NMOS transistor connected in parallel to the first NMOS transistor and having a source, a drain and a gate, said gate receiving from said flip-flop said one of a data to be used for obtaining an optimum offset value and a data to be trimmed;
    a third NMOS transistor having a source, a drain and a gate said gate connected to the drains of the first PMOS transistor, and the first and second NMOS transistors;
    a fourth NMOS transistor having a drain connected to sources of the first and second NMOS transistors, and a gate connected to an enable terminal;
    a metal resistor connected between a source of the third NMOS transistor and the ground;
    a second inverter having an output of an inverted signal from the enable terminal; and
    a second PMOS transistor for outputting a power supply voltage responsive to the output from the second inverter.

3. The offset trimming circuit of claim 1, wherein the selection logic circuit includes:
    a first inverter for inverting a fuse cutting signal;
    a nand gate for obtaining a negative logical product from the operation mode selection signal and the output of the first inverter; and
    a multiplexer for receiving an output from the nand gate, a signal obtained by inverting the output from the nand gate, an output signal from the fuse circuit, and an output of the flip-flop and selectively outputting one of the output signal from the fuse circuit and the output of the flip-flop.

4. An offset generation circuit, comprising
    a plurality of offset trimming circuits, each one of said plurality of offset trimming circuits including
        a flip flop for receiving one of a data to be used for obtaining an optimum offset value or a data to be trimmed and transmitting said one of said data to be used for obtaining an optimum offset value or a data to be trimmed according to an input clock;
        a fuse circuit for storing and transmitting a corrected optimum offset value obtained in a corresponding mode by receiving, as input signals, the data transmitted by the flip-flop and a mode selection signal and;
        a selection logic circuit responsive to the mode selection circuit for outputting a selected signal as a trimming output signal by selecting one from the group consisting of the data transmitted by the flip-flop and the corrected optimum offset value and
    a calibration circuit for receiving the selected signal from each one of the plurality of offset trimming circuits as an input, measuring a characteristic of the input, and outputting an offset based on the characteristic.

5. The offset generation circuit of claim 4, further comprising a shift resistor constituted by connecting the flip-flops in each cell in series.

* * * * *